(12) United States Patent
Wang et al.

(10) Patent No.: US 8,550,149 B2
(45) Date of Patent: Oct. 8, 2013

(54) WATER-COOLED HEAT SINK

(75) Inventors: Jun Wang, Shenzhen (CN);
Chien-Ming Chih, Taipei Hsien (TW);
Chen-Li Kao, Taipei Hsien (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 853 days.

(21) Appl. No.: 12/650,871

(22) Filed: Dec. 31, 2009

(65) Prior Publication Data
US 2011/0100597 A1    May 5, 2011

(30) Foreign Application Priority Data

Oct. 30, 2009 (CN) .......................... 2009 1 0309091

(51) Int. Cl.
*F28F 7/00* (2006.01)
*H05K 7/20* (2006.01)
*F04B 17/00* (2006.01)

(52) U.S. Cl.
USPC ........... 165/80.4; 417/415; 417/420; 361/699

(58) Field of Classification Search
USPC ................ 165/80.4; 417/415, 420; 361/699, 361/688
See application file for complete search history.

(56) References Cited

U.S. PATENT DOCUMENTS

| | | | | |
|---|---|---|---|---|
| 5,384,687 A | * | 1/1995 | Sano | 361/689 |
| 5,911,272 A | * | 6/1999 | Cornog et al. | 165/104.25 |
| 7,694,721 B2 | * | 4/2010 | Lai et al. | 165/80.4 |
| 8,011,903 B2 | * | 9/2011 | Pollack | 417/420 |
| 2002/0046825 A1 | * | 4/2002 | Huang et al. | 165/80.4 |
| 2003/0121643 A1 | * | 7/2003 | Connors | 165/80.3 |
| 2003/0173061 A1 | * | 9/2003 | Lai et al. | 165/80.4 |
| 2004/0182545 A1 | * | 9/2004 | Payne | 165/80.4 |
| 2007/0236854 A1 | * | 10/2007 | Lee et al. | 361/143 |
| 2008/0075611 A1 | * | 3/2008 | Lai et al. | 417/420 |
| 2008/0164011 A1 | * | 7/2008 | Chen | 165/104.33 |
| 2009/0040723 A1 | * | 2/2009 | Lin et al. | 361/699 |

* cited by examiner

*Primary Examiner* — Brandon M Rosati
(74) *Attorney, Agent, or Firm* — Altis Law Group, Inc.

(57) ABSTRACT

A water-cooled heat sink includes a base, a box, a propelling module, a driving module, and a plurality of conduits. The box is disposed above the base, and receives a cooled liquid. The driving module includes a first magnet. The base defines a plurality of channels. The propelling module includes a cylinder, a piston, a second magnet, and a valve. The cylinder is disposed on an inner wall of the box. The piston is disposed in the cylinder, and defines a through hole in a middle portion thereof. The second magnet is fixed to the piston. The valve is fixed in the through hole. The conduits interconnect the cylinder and the box. The first magnet can repel or attract the second magnet, thereby sliding the piston toward the cylinder to close the valve or away from the cylinder to open the valve.

20 Claims, 7 Drawing Sheets

WATER-COOLED HEAT SINK

BACKGROUND

1. Technical Field

The present disclosure relates to heat sinks, and particularly, to a water-cooled heat sink.

2. Description of the Related Art

An electronic component, such as a CPU, generates considerable heat, which, if not dissipated, can degrade performance or damage the electronic component.

A frequently used water-cooled heat sink includes a box, a cover, a driving module, and a propelling module. The box receives a cooled liquid. The driving module and the propelling module are received in the box. The driving module is isolated from the cooled liquid, and the propelling module is immersed in the cooled liquid. The box cover seals the box at a top thereof. The box cover defines an inlet for introducing the cooled liquid and an outlet for draining the cooled liquid. The driving module includes a rotatable shaft, a stator coil, a magnet ring and a waterproof plate. The propelling module includes an impeller between the inlet and the outlet. The impeller and the magnet ring are fixed at opposite ends of the rotatable shaft. The waterproof plate is disposed between the stator coil and the magnet ring, and is connected to an inner sidewall of the box to seal the stator coil. The stator coil attracts the magnet ring to drive the impeller to rotate, such that the cooled liquid is introduced into the inlet and drained out from the outlet. However, the driving module often generates vibration during use. In time, a gap can occur between the waterproof and the inner sidewall of the box, through which cooled liquid may permeate to the stator coil, which may cause a short circuit.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION

Figure 1:
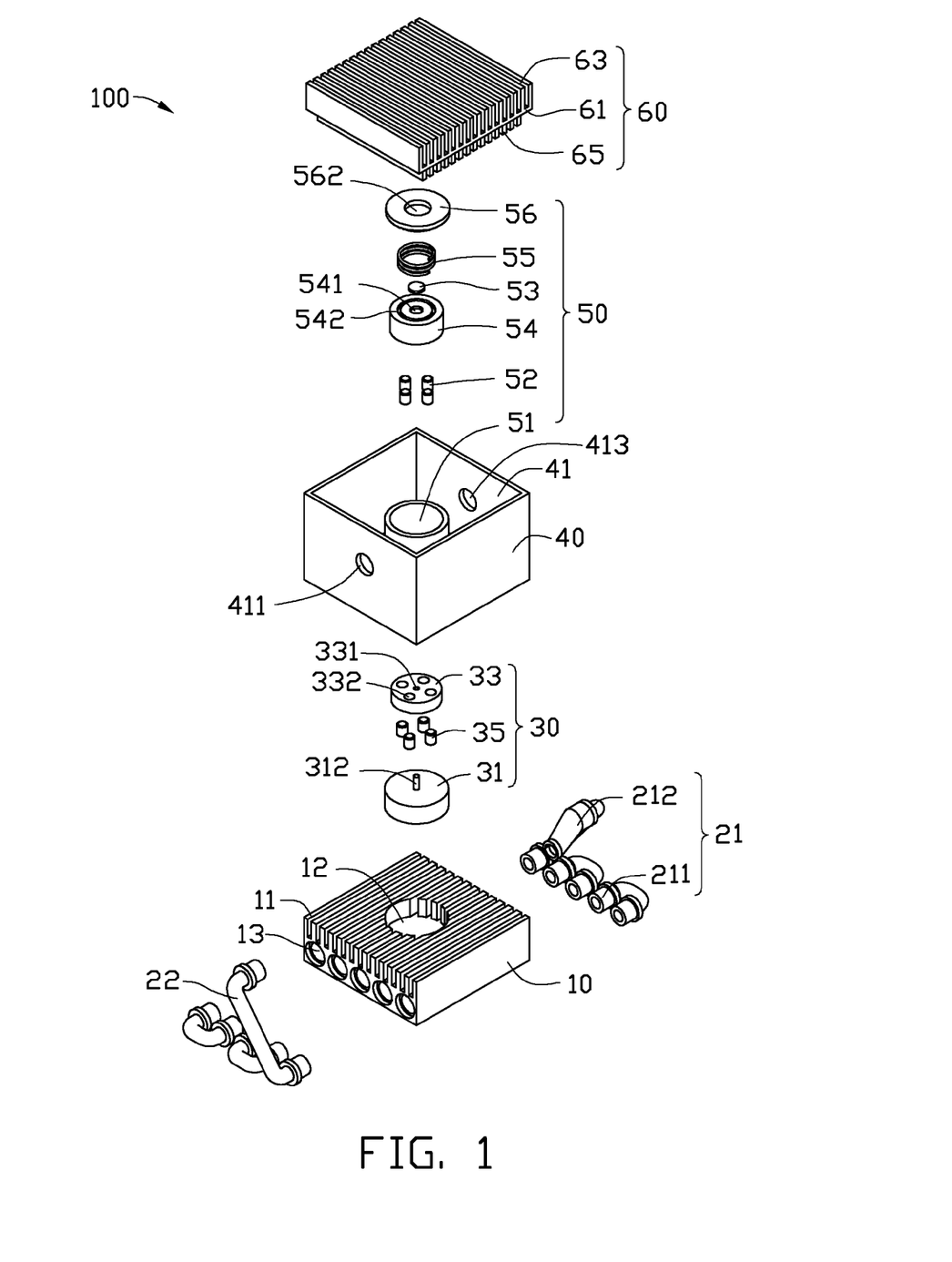
FIG. 1 is an exploded, isometric view of a first embodiment of a water-cooled heat sink.
Figure 2:
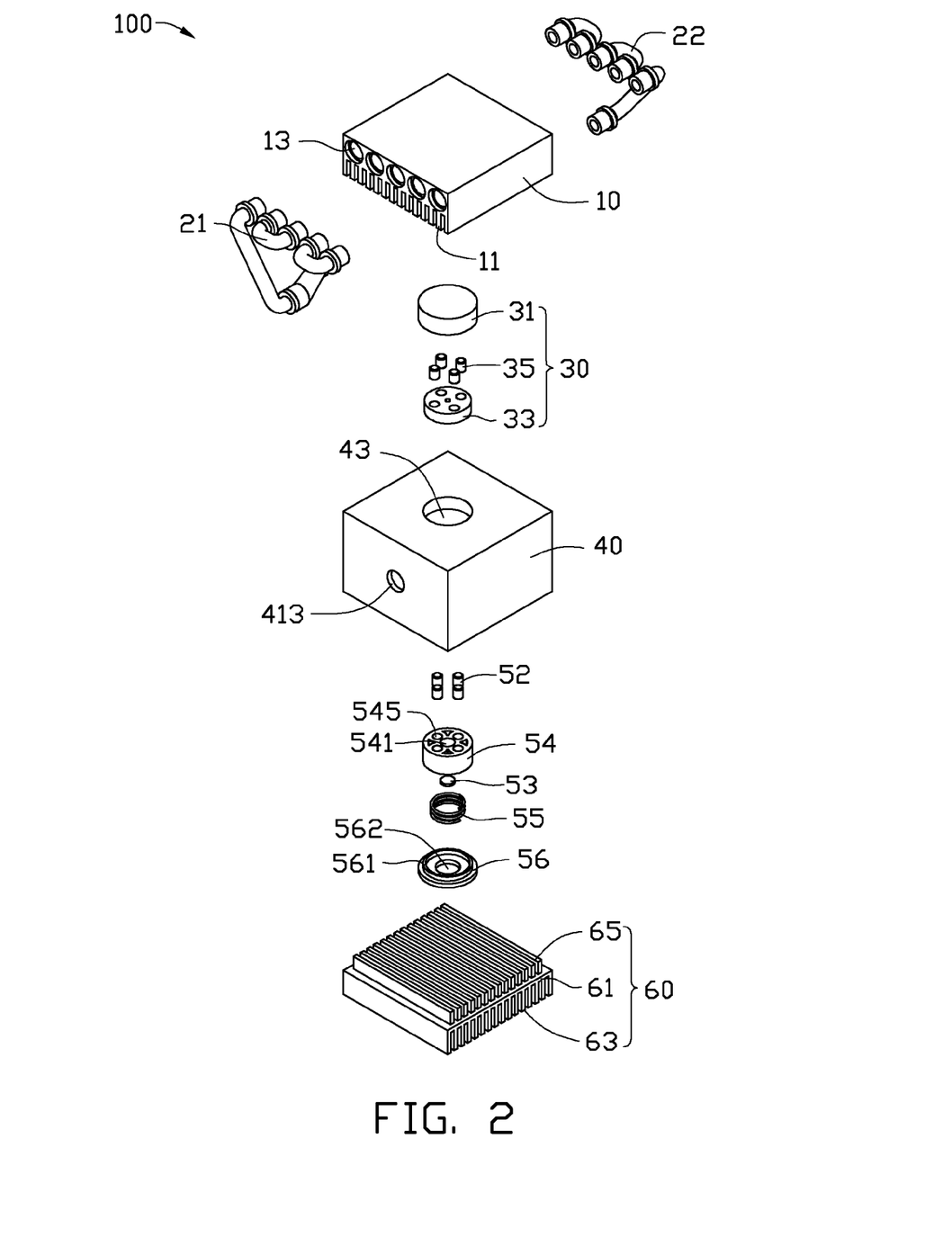
FIG. 2 is similar to FIG. 1, but viewed from another aspect.

Referring to FIGS. 1 and 2, a first embodiment of a water-cooled heat sink 100 includes a base 10, a first conduit 21, a second conduit 22, a driving module 30, a box 40, a propelling module 50, and a box cover 60. The box 40 is substantially rectangular and has an opening 41 at a top thereof. The box 40 defines a receiving groove 43 to receive the driving module 30 in a bottom plate of the box 40. The box 40 is disposed on the base 10. The box 40 further defines a water inlet hole 411 and a through hole 413 at opposite sidewalls. The water inlet hole 411 is configured to connect with the second conduit 22. the through hole 413 is configured tom allow the first conduit 21 to pass through. The driving module 30 is fixed between the base 10 and the box 40. The propelling module 50 is received in the box 40. The first conduit 21 passes through the through hole 413 of the box 40, and interconnects the base 10 and the propelling module 50, and the second conduit 22 interconnects the base 10 and the box 40. The box cover 60 seals the opening 41 at the top of the box 40.

The base 10 includes a plurality of cooling fins 11 on the upper surface of the base 10 contacting the bottom of the box 40. The cooling fins 11 cooperatively define a receiving portion 12 in a middle portion thereof. The base 10 further defines a plurality of channels 13 in a body of the base 10. The channels 13 are substantially parallel.

Each conduit of the first conduit 21 and the second conduit 22 is a flexible tube. The first conduit 21 and the second 22 are respectively fixed to opposite sides of the base 10 to communicate with the corresponding channels 13. The first conduit 21 includes a first guiding portion 211 and a second guiding portion 212 extending from the first guiding portion 211. The first guiding portion 211 has a substantially a same shape with the second conduit 22. The first guiding portion 211 interconnects the channels 13 and the through hole 413 of the box 40, and passes through the through hole 413. The second guiding portion 212 interconnects the propelling module 50 and the first guiding portion 211, thereby the first conduit 21 interconnects the channels 13 of the base 10 and the propelling module 50. The second conduit 22 interconnects the channels 13 of the base 10 and the water inlet hole 411 of the box 40.

The driving module 30 includes a motor 31, a rotor 33, and a plurality of first magnets 35. The motor 31 includes a rotatable shaft 312 fixed to the rotor 33. The rotor 33 includes a through hole 331 defined in a middle portion of the rotor 33 and a plurality of fixing holes 332 defined in the rotor 33 surrounding the through hole 331. Each first magnet 35 is received in the corresponding fixing hole 332. A free end of the rotatable shaft 312 is fixed into the through hole 331. In the illustrated embodiment, each first magnet 35 is a cylindrical permanent magnet.

The propelling module 50 includes a cylinder 51, a plurality of second magnets 52, a valve 53, a piston 54, a spring 55 and a cylinder cover 56. The cylinder 51 is fixed in a bottom of the box 40. The cylinder 51 defines a water outlet hole 511 corresponding to the through hole 413 or the box 40. The water outlet hole 511 is configured to connect the first conduit 21. Polarity of the second magnet 52 is the same as the first magnet 35. The piston 54 defines a through hole 541, an annular groove 542 and a plurality of fixing grooves 545. The through hole 541 is defined in a middle portion of an end surface of the piston 54. The annular groove 542 is defined in the end surface of the piston 54 surrounding the through hole 541. The plurality of fixing grooves 545 is defined in the other end surface of the piston 54. Each second magnet 52 is received in the corresponding fixing groove 545. The valve 53 is received in the through hole 541, and flexibly fixed to the piston 54. The cylinder cover 56 is fixed at an open end of the cylinder 51. The cylinder cover 56 includes a fixing portion 561 disposed at a first surface of the cylinder cover 56. The cylinder cover 56 defines a through hole 562 in a middle portion of a second surface of the cylinder cover 56 opposite to the first surface. The spring 55 is received in the cylinder, and biases the cylinder cover 56 and the piston 54. In the illustrated embodiment, the cylinder 51 and the box 40 are integrally formed. Each second magnet 52 is a cylindrical permanent magnet, and the through hole 541 is stepped.

The box cover 60 includes a base plate 61, and a plurality of first cooling fins 63 and plurality of second cooling fins 65 disposed on opposite sides of the base plate 61. The second cooling fins 65 are smaller than first cooling fins 63. The second cooling fins 65 are received in the box 40.

Figure 3:
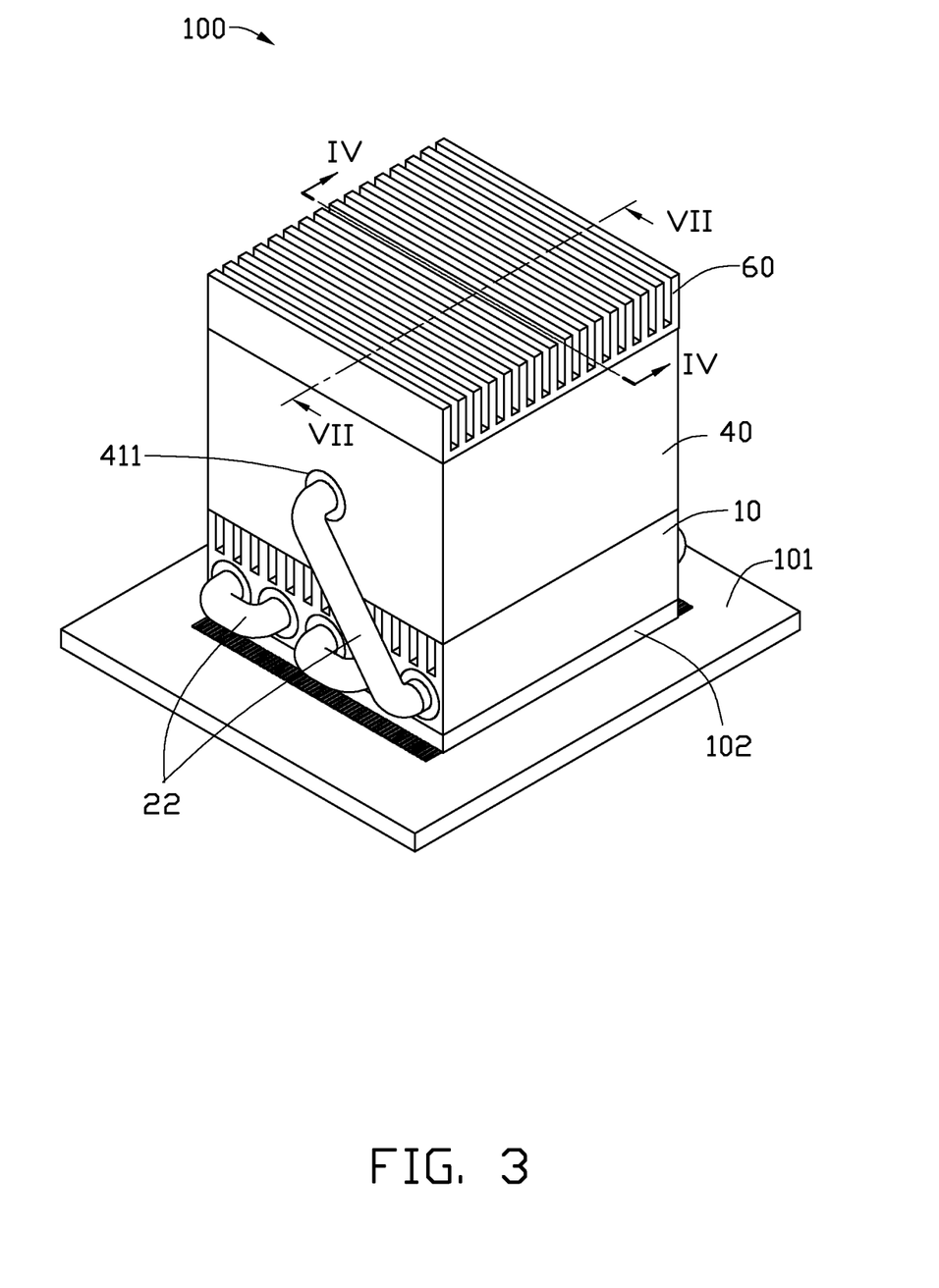
FIG. 3 is an assembled, isometric view of the water-cooled heat sink shown in FIG. 1.
Figure 7:
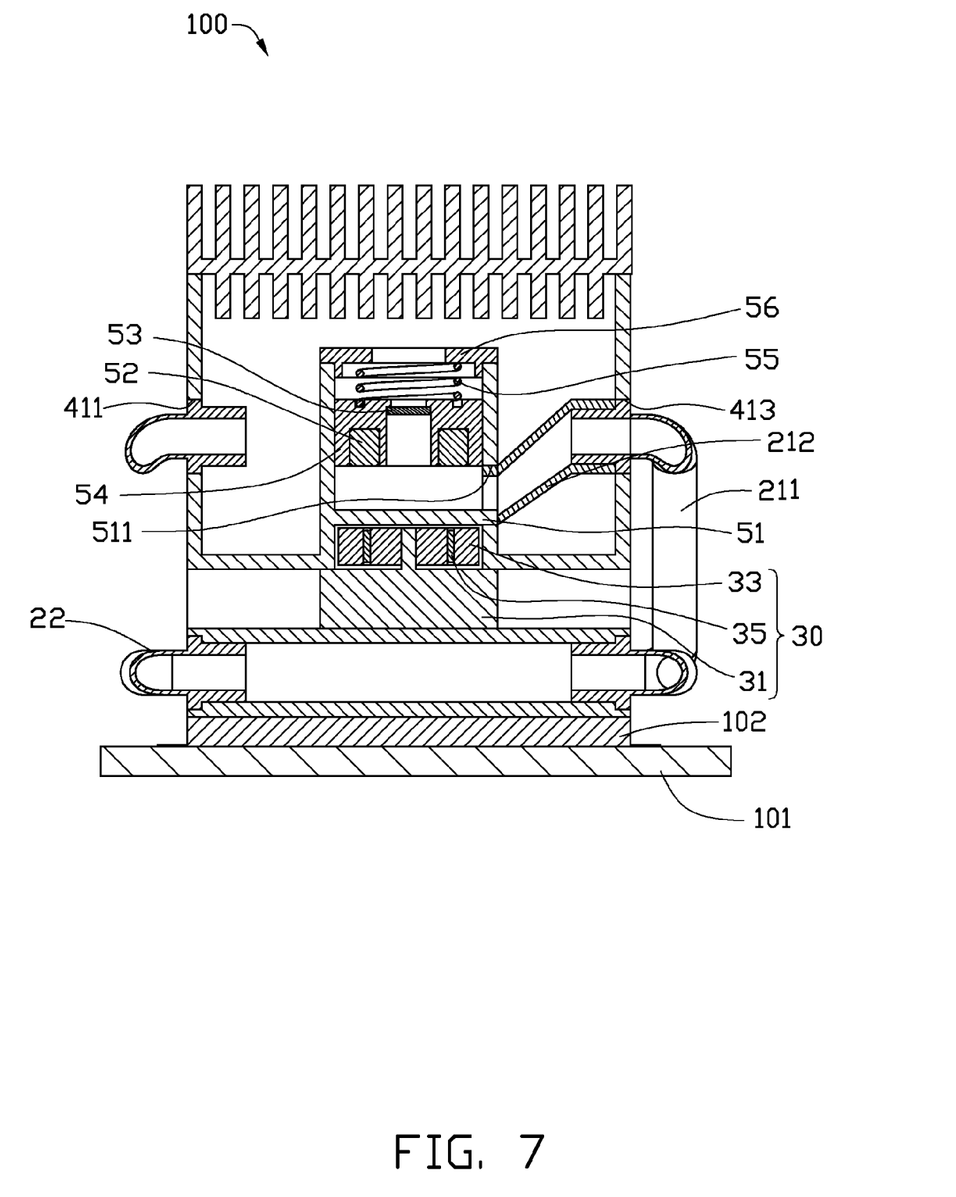
FIG. 7 is a cross-section of the water-cooled heat sink taken along line VII-VII of FIG. 3.

Referring to FIG. 3 and 7, during assembly of the water-cooled heat sink 100, the driving module 30 is received in the receiving portion 12 of the base 10. The box 40 is fixed on the cooling fins 11 of the base 10. The driving module 30 is received in the receiving groove 43 of the box 40. The valve 53 is fixed into the through hole 541. The second magnets 52 are fixed into the fixing grooves 542 of the piston 54. The piston 54 slides in the cylinder 51. An end of the spring 55 is disposed in the annular groove 542. The cylinder cover 56 is fixed at an open end of cylinder 51. The second conduit 22 interconnects the water inlet hole 411 of the box 40 and the channels 13 of the base 10, and the second guiding portion 212 of the first conduit 21 is received in the box 40 and connects the water outlet hole 511 of the cylinder 51, thereby the first conduit 21 interconnects the water outlet hole 511 of the cylinder 51 of the propelling module 50 and the channels 13 of the base 10. The box cover 60 seals the opening 41 of the box 40, and the second cooling fins 65 are received into box 40.

In use, the base 10 of the water-cooled heat sink 100 is fixed to an electronic component 102. The electronic component 102 is fixed to a fixing plate 101. In the illustrated embodiment, the electronic component 102 is a CPU of a computer (not shown). The fixing plate 101 is a motherboard of the computer. The cooled liquid absorbs heat produced by the electronic component 102 via the cooling fins 11 of the base 10, and radiates the heat via the box cover 60 and the sidewalls of the box 40.

Figure 4:
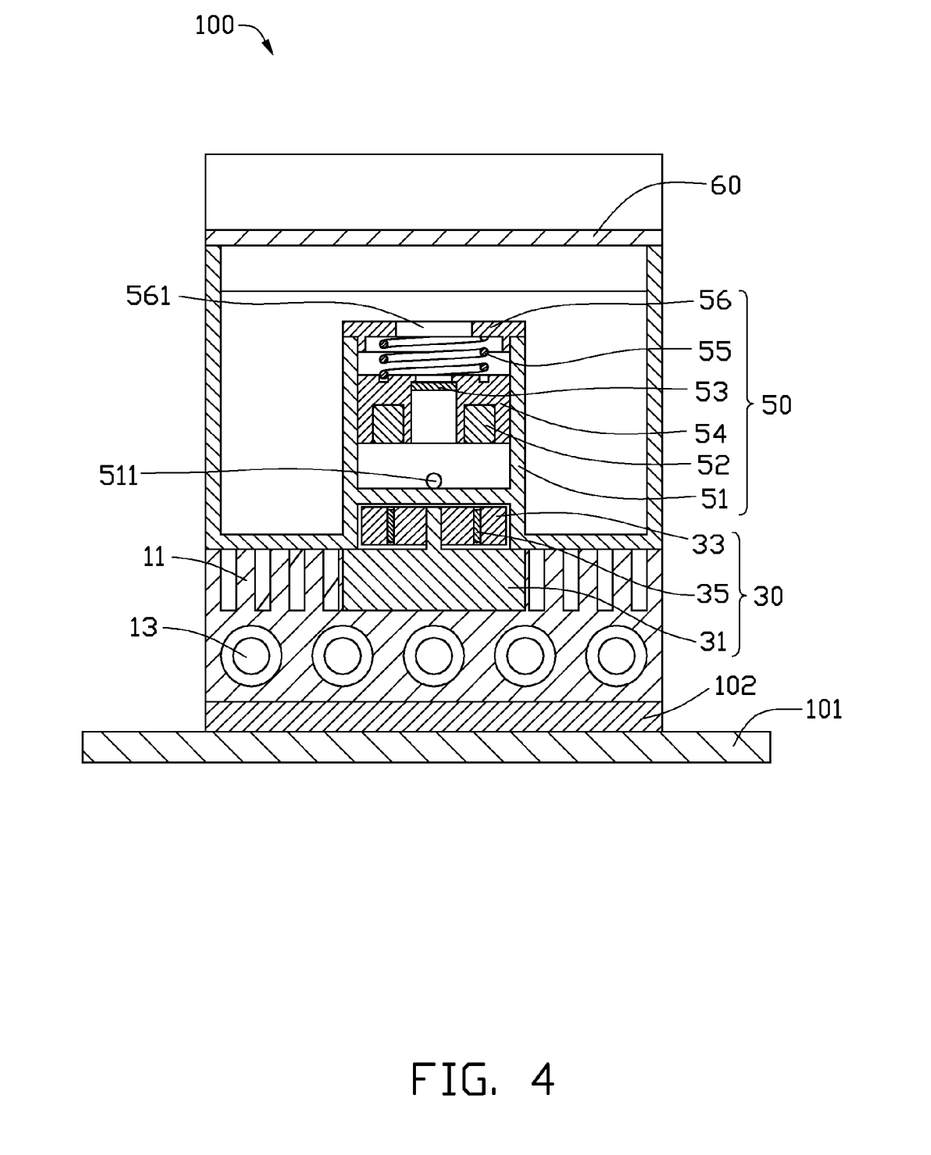
FIG. 4 is a cross-section of the water-cooled heat sink taken along line IV-IV of FIG. 3.

Referring to FIGS. 3, 4 and 7, a function of the water-cooled heat sink 100 is described below.

In a first stoke, the rotor 33 of the driving module 30 rotates at a first position, where the first magnet 35 of the driving module 30 repels the second magnet 52 of the propelling module 50. The spring 55 is elastically deformed by resisting the piston 54. The piston 54 of the propelling module 50 slides toward the cylinder cover 56 and opens the valve 53, whereby cooled liquid is introduced from the box 40 into the cylinder 51.

In a second stoke, the rotor 33 of the driving module 30 rotates at a second position where a repellent force between the first magnet 35 and the second magnet 52 is less than the elastic force of the spring 55. The spring 55 is again deformed. The piston 54 slides toward to the driving module 30 and closes the valve 53, whereby cooled liquid in the cylinder 51 is drained from the water outlet hole 511 the cylinder 51 into the channels 13 of the base 10. The liquid absorbs heat produced by the electronic components 102 via the coolings fins 11 of the base 10, and then flow into the box 40 from the water inlet hole 411 of the box 40, thus the liquid radiates the heat via the box cover 60 and the sidewalls of the box 40.

The driving module 30 is fixed on an outer surface of the box 40, and not contacting the propelling module 50. The cooled liquid cannot permeate the box 40, and the propelling module 50, thus the driving module 30 remains dry and undamaged.

It is to be understood that the second magnet 52 can be an electromagnet. The spring 55 can also be omitted, whereby the piston 54 slides in the cylinder 51 by its own weight. Only one first magnet 35 and one second magnet 52 can be used instead.

Figure 5:
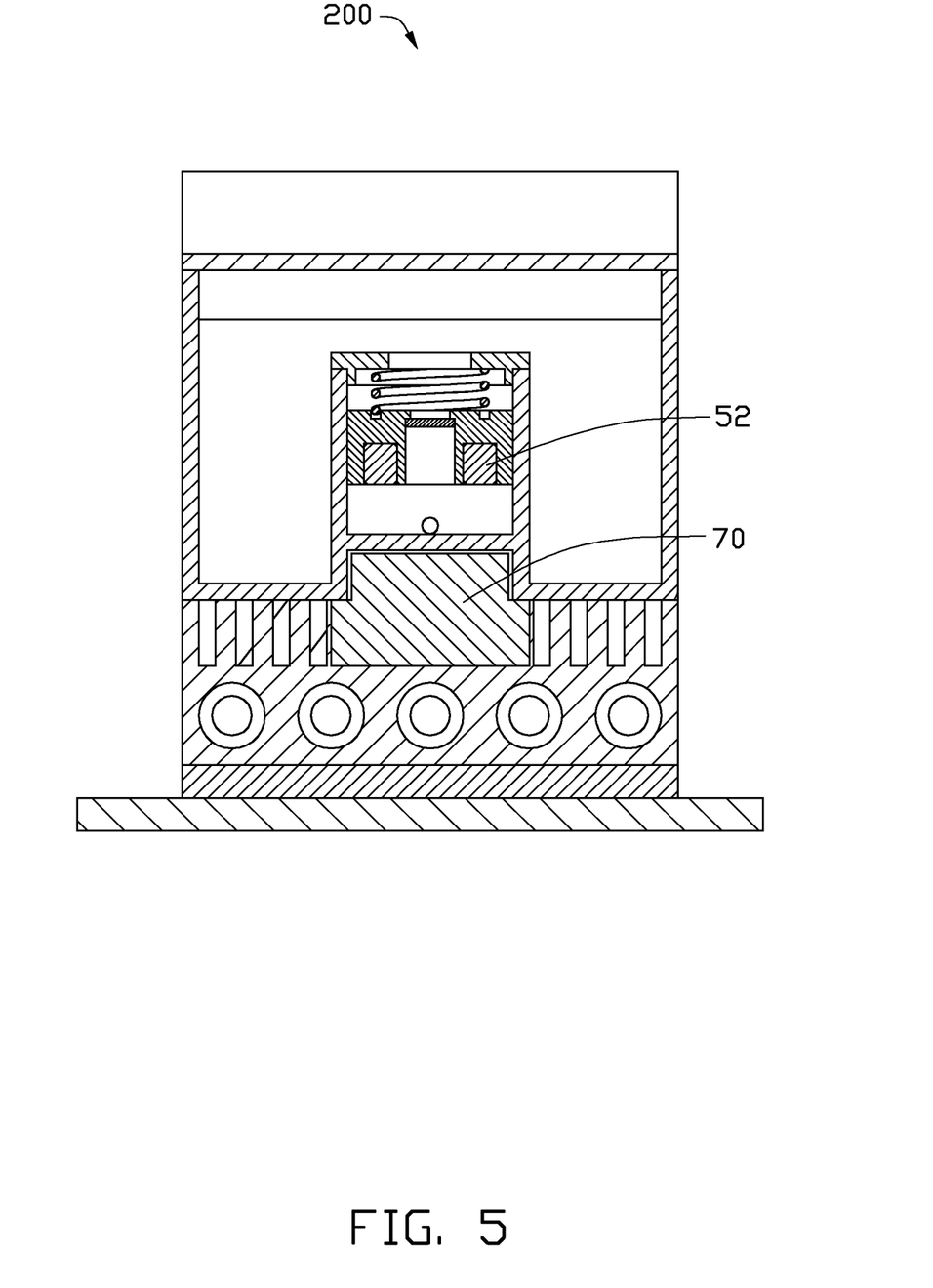
FIG. 5 is a cross-section of a second embodiment of a water-cooled heat sink.
Figure 6:
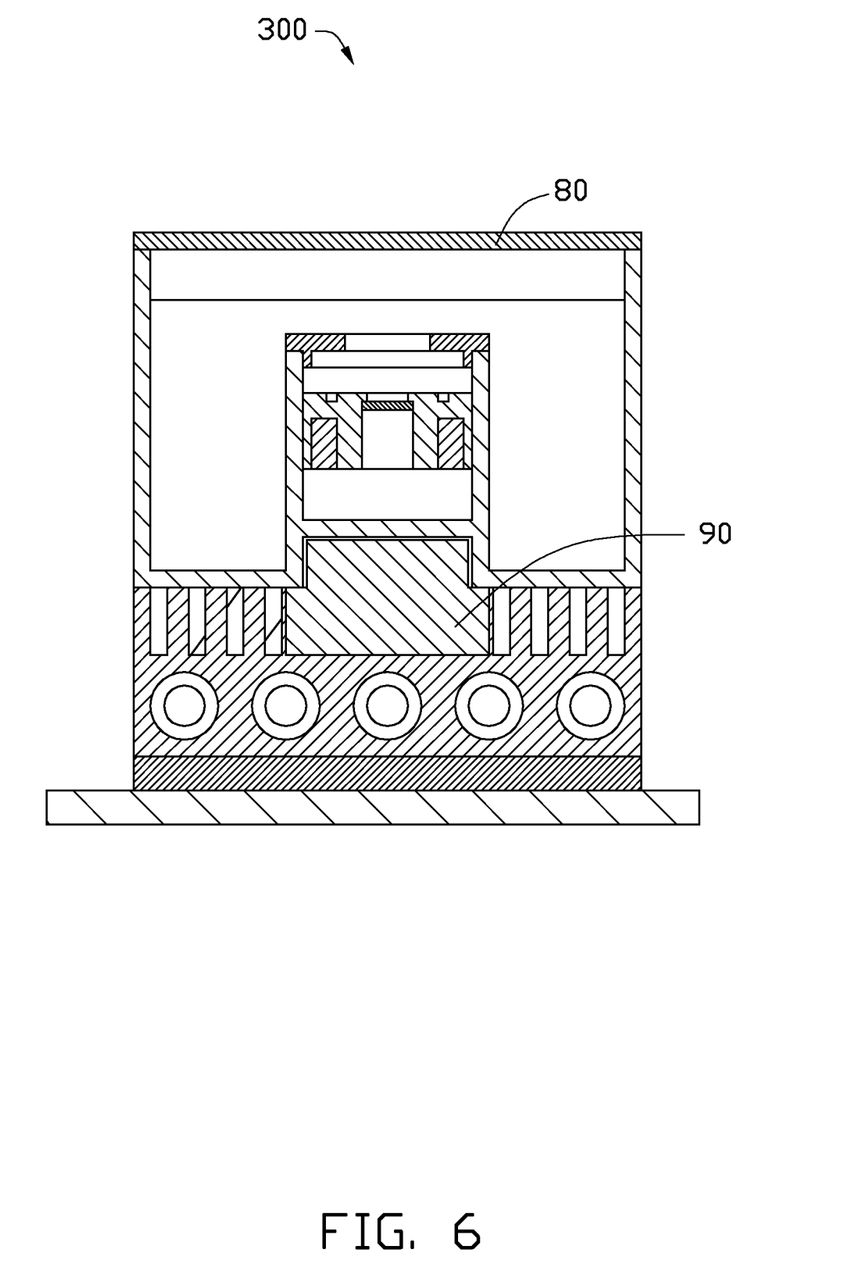
FIG. 6 is a cross-section of a third embodiment of a water-cooled heat sink.

Referring to FIG. 5, a second embodiment of a water-cooled heat sink 200 differs from the first embodiment of the water-cooled heat sink 100 only in that the first magnet 70 is an electromagnet replacing the driving module 30. The first magnet 70 utilizes a unipolar pulse current, such that a repellent force is intermittently generated between the first magnet 70 and the second magnet 52.

Referring to FIG. 7, a third embodiment of an water-cooled heat sink 300 differs from the second embodiment of the water-cooled heat sink 100 only in that the box cover 80 is a flat plate and the spring 55 is omitted. The first magnet 90 uses a bipolar pulse current, such that repellent and attraction forces are alternately generated between the first magnet 90 and the second magnet 52.

Finally, while the present disclosure has been described with reference to particular embodiments, the description is illustrative of the disclosure and is not to be construed as limiting the disclosure. Therefore, various modifications can be made to the embodiments by those of ordinary skill in the art without departing from the true spirit and scope of the disclosure as defined by the appended claims.

What is claimed is:

1. A water-cooled heat sink comprising:
a base with substantially parallel fins on top of the base and substantially parallel channels extending through the base; a box fixed on the substantially parallel fins of the base and receiving a cooled liquid; a driving module fixed between the base and an outer surface of the box, in a receiving portion, the driving module comprising a first magnet;
a propelling module fixed into the box, comprising a cylinder fixed in a bottom of the box, a piston disposed in the cylinder and defining a through hole, a second magnet fixed in the piston, and a valve received in the through hole;
a first conduit interconnecting the base and the cylinder; and
a second conduit interconnecting the base and the box, wherein the first magnet repels the second magnet to drive the piston away from the second magnet to open the valve, such that the cooled liquid is introduced from the box into the cylinder, the box further defines a water inlet hole and a through hole, the cylinder defines a water outlet hole, the first conduit passes through the through hole of the box, and interconnects the base and the water outlet hole of the cylinder, the second conduit interconnects the base and the water inlet hole of the box.

2. The water-cooled heat sink of claim 1, wherein the driving module further comprises a motor having a rotatable shaft and a rotor fixed to the rotatable shaft, the first magnet being fixed to the rotor.

3. The water-cooled heat sink of claim 2, wherein the propelling module further comprises a cylinder cover fixed at an open end of the cylinder and a spring received in the cylinder, the spring biasing the cylinder cover and the piston.

4. The water-cooled heat sink of claim 1, wherein the base comprises a plurality of cooling fins on an upper surface thereof contacting the bottom of the box.

5. The water-cooled heat sink of claim 4, wherein the cooling fins cooperatively define a receiving portion in a middle portion thereof.

6. The water-cooled heat sink of claim 1, wherein the first magnet is an electromagnet.

7. The water-cooled heat sink of claim 6, wherein the first magnet uses a unipolar pulse current to generate a repellent force intermittently between the first magnet and the second magnet.

8. The water-cooled heat sink of claim 6, wherein the first magnet uses a bipolar pulse current, in which a repellent force and an attracting force are alternately generated between the first magnet and the second magnet.

9. The water cooled heat sink of claim 1, further comprising a box cover sealing an opening at the top of the box.

10. The water-cooled heat sink of claim 9, wherein the box cover comprises a base plate, a plurality of first and second cooling fins disposed substantially perpendicularly on opposite sides of the base plate, the second cooling fins being received in the box.

11. A water-cooled heat sink comprising:
a base with substantially parallel fins on top of the base and substantially parallel channels extending through the base; a box fixed on the substantially parallel fins of the base and receiving a cooled liquid; a driving module fixed between the base and an outer surface of the box, in a receiving portion, the driving module comprising a first magnet;
a propelling module fixed into the box, comprising a cylinder fixed on an inner wall of the box, a piston disposed in the cylinder and defining a through hole, a second magnet fixed in the piston, and a valve received in the through hole;
a first conduit interconnecting the base and the cylinder; and
a second conduit interconnecting the base and the box, wherein attraction between the first magnet and the second magnet moves the piston toward the second magnet and closes the valve, such that the cooled liquid is drained from the cylinder into the base, the box further defines a water inlet hole and a through hole, the cylinder defines a water outlet hole, the first conduit passes through the through hole of the box, and interconnects the base and the water outlet hole of the cylinder, the second conduit interconnects the base and the water inlet hole of the box.

12. The water-cooled heat sink of claim 11, wherein the driving module further comprises a motor having a rotatable shaft and a rotor fixed to the rotatable shaft, the first magnet being fixed to the rotor.

13. The water-cooled heat sink of claim 12, wherein the propelling module further comprises a cylinder cover fixed at an open end of the cylinder.

14. The water-cooled heat sink of claim 13, wherein the propelling module further comprises a spring received in the cylinder and biasing the cylinder cover and the piston.

15. The water-cooled heat sink of claim 11, wherein the base comprises a plurality of cooling fins on an upper surface thereof and contacting a bottom of the box.

16. The water-cooled heat sink of claim 15, wherein the cooling fins cooperatively defines a receiving portion in a middle portion thereof.

17. The water-cooled heat sink of claim 11, wherein the first magnet is an electromagnet.

18. The water-cooled heat sink of claim 17, wherein the first magnet uses a bipolar pulse current, in which a repellent force and a attracting force are alternately generated between the first magnet and the second magnet.

19. The water cooled heat sink of claim 1, further comprising a box cover sealing an opening at the top of the box.

20. The water-cooled heat sink of claim 19, wherein the box cover comprises a base plate with a plurality of first and second cooling fins disposed on opposite sides thereof, and the second cooling fins are received in the box.

* * * * *